(12) United States Patent
Soreff et al.

(10) Patent No.: US 7,191,419 B2
(45) Date of Patent: Mar. 13, 2007

(54) METHOD OF TIMING MODEL ABSTRACTION FOR CIRCUITS CONTAINING SIMULTANEOUSLY SWITCHING INTERNAL SIGNALS

(75) Inventors: Jeffrey Paul Soreff, Poughkeepsie, NY (US); James Douglas Warnock, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 150 days.

(21) Appl. No.: 10/897,349

(22) Filed: Jul. 22, 2004

(65) Prior Publication Data

US 2006/0031797 A1 Feb. 9, 2006

(51) Int. Cl.
*G06F 17/50* (2006.01)

(52) U.S. Cl. .............................. 716/6; 716/4

(58) Field of Classification Search .................. 716/6, 716/4
See application file for complete search history.

(56) References Cited

U.S. PATENT DOCUMENTS

| | | | | |
|---|---|---|---|---|
| 5,650,938 | A * | 7/1997 | Bootehsaz et al. | 716/6 |
| 6,370,676 | B1 * | 4/2002 | Hayashi et al. | 716/6 |
| 6,698,005 | B2 * | 2/2004 | Lindkvist | 716/6 |
| 6,700,536 | B1 * | 3/2004 | Wiegand | 342/417 |
| 6,721,930 | B2 * | 4/2004 | Sasaki et al. | 716/6 |
| 2003/0145298 | A1 * | 7/2003 | Pie et al. | 716/7 |
| 2005/0065765 | A1 * | 3/2005 | Visweswariah | 703/19 |
| 2005/0066297 | A1 * | 3/2005 | Kalafala et al. | 716/6 |
| 2005/0190193 | A1 * | 9/2005 | Freker et al. | 345/534 |
| 2006/0048086 | A1 * | 3/2006 | Pie et al. | 716/6 |
| 2006/0112359 | A1 * | 5/2006 | Becer et al. | 716/6 |
| 2006/0195807 | A1 * | 8/2006 | Foreman et al. | 716/6 |

* cited by examiner

*Primary Examiner*—Paul Dinh
*Assistant Examiner*—Suchin Parihar
(74) *Attorney, Agent, or Firm*—Carr LLP; D'Ann Rifai (57) ABSTRACT

The present invention provides for determining arrival times in a circuit. An arrival time for a main signal is assigned. An arrival time for a secondary signal is assigned. It is determined whether a test is for an early arrival or for a later arrival. If the test type is for a late arrival, it is determined whether the arrival time for the secondary signal is later than for the first signal. If the test type is for an early arrival, it is determined whether the arrival time for the secondary signal is earlier than for the first signal. If the test type is for the late arrival and the arrival time for the secondary signal is later than for the first signal, assume maximum interference between the signals. If the test type is for the late arrival and the arrival time for the secondary signal is not later than for the first signal, calculate the actual interference between the signals.

17 Claims, 5 Drawing Sheets

*PRIOR ART*

FIG. 3A

*PRIOR ART*

FIG. 3B

*PRIOR ART*

METHOD OF TIMING MODEL ABSTRACTION FOR CIRCUITS CONTAINING SIMULTANEOUSLY SWITCHING INTERNAL SIGNALS

TECHNICAL FIELD

The present invention relates generally to circuit analysis and, more particularly, to the detection of timing events within the circuits.

BACKGROUND

With the increasing clock speed of integrated circuits (ICs), the relative timing between two or more signals received at the same component is becoming more and more of a design consideration and constraint. Generally, in ICs, there is a typical propagation rate through a given component of an IC. Therefore, the time of propagation of a signal that arrives over a first signal path is synchronized with a computer clock, and a second signal that arrives over a signal path is also synchronized with the computer clock. These signal path propagation times can be calculated and appropriate design choices made. However, if two signals are received at the separate inputs at substantially the same time or relatively close in time to one another, the propagation speed of the resulting signal through that component can be either substantially shorter or substantially longer than the design considerations typically allow for. This can create two potential error conditions in chip design.

The first error condition is generally known as a "late mode" failure, wherein the signal takes longer to propagate, due to simultaneous reception by a component of two incoming signals, than was accounted for in the ideal "non-simultaneous reception" case. The "late mode" case can typically be compensated for slowing the computer clock cycle speed, thereby allowing the signal time to get to the next clock-synchronized component.

The second error condition is an "early mode" failure. In a race condition, due to the substantially simultaneous receipt of two different signals, the resulting signal propagates out of the component faster than anticipated. This is especially irksome, as typically the simultaneous receipt of two independent signals is itself not a function of a received clock cycle, so slowing down the clock cycle typically will not prevent an early condition. Conventional technologies and methods for calculating acceptable design margins to account for both the early and late conditions tend to be either unwieldy, unacceptably inaccurate, or both.

Therefore, there is a need for a method and/or system for estimating design parameters for both early and late race conditions in IC design that addresses at least some of the problems associated with conventional methods and/or systems for estimating design parameters for both late and early race conditions.

SUMMARY OF THE INVENTION

The present invention provides for determining arrival times in a circuit. An arrival time for a main signal is assigned. An arrival time for a secondary signal is assigned. It is determined whether a test is for an early arrival or for a later arrival. If the test type is for a late arrival, it is determined whether the arrival time for the secondary signal is later than for the first signal. If the test type is for an early arrival, it is determined whether the arrival time for the secondary signal is earlier than for the first signal.

BRIEF DESCRIPTION OF THE DRAWINGS

For a more complete understanding of the present invention, and the advantages thereof, reference is now made to the following Detailed Description taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

In the remainder of this description, a processing unit (PU) may be a sole processor of computations in a device. In such a situation, the PU is typically referred to as an MPU (main processing unit). The processing unit may also be one of many processing units that share the computational load according to some methodology or algorithm developed for a given computational device. For the remainder of this description, all references to processors shall use the term MPU whether the MPU is the sole computational element in the device or whether the MPU is sharing the computational element with other MPUs, unless otherwise indicated.

It is further noted that, unless indicated otherwise, all functions described herein may be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise.

Figure 1:
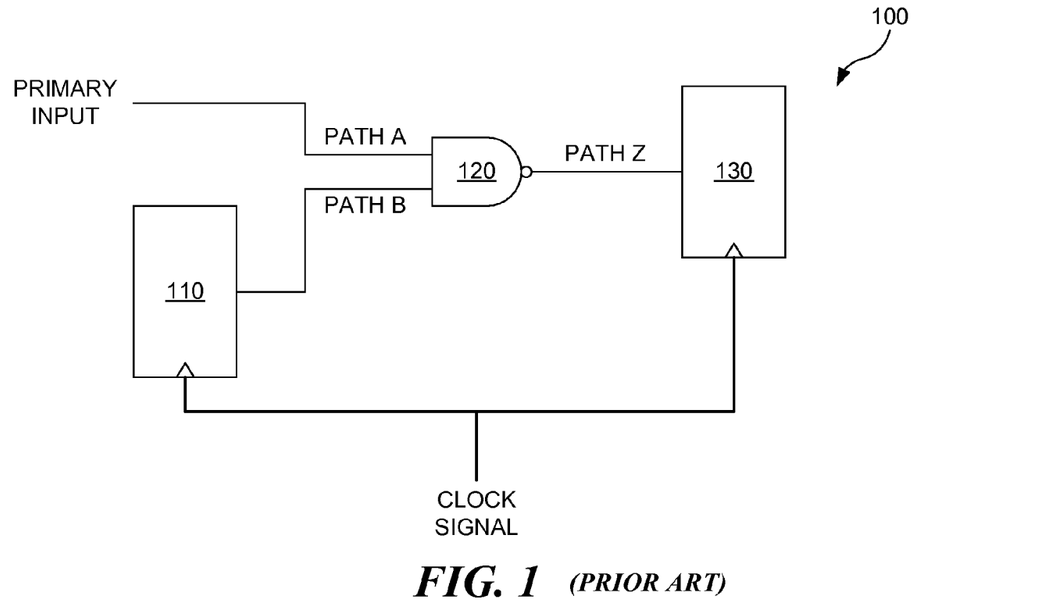
FIG. 1 schematically depicts a first circuit having potential timing problems in which timing analysis can take place.

Turning now to FIG. 1, disclosed is a system 100 that can have timing problems. A NAND gate 120 has a primary input, path "A", and a secondary input, path "B". The output of a latch 110 is coupled to path B, and the output of the NAND gate 120 is coupled to the input of a latch 130. Both the latch 110 and the latch 130 are driven by the same clock signal.

In FIG. 1, the two signal paths, path A and path B, are shown converging at a single gate, the NAND gate 120.

These two signal paths could be analyzed separately, as long as the signal arrival times through path A and through path B are different enough so that there is not any substantial signal propagation speed interference with either signal over path A or path B.

For instance, if this relative lack of interference is assumed to be true, then a basic timing abstract can be generated. Generally, a timing abstract can be defined as a distillation of the timing characteristics of devices over a given area of a chip. These timing abstracts can then be adjoined to create a more and more intricate model of the IC behavior. In the event of no significant interference, the timing abstract would contain a description of the propagation delay from the primary input, path A, through the NAND 120, to the receiving latch 130, as well as a description of the delay from the clock to the output of the launching latch 110, through NAND 120, to the receiving latch 130. Even though both the launch latch 110 and the receiving latch 130 are triggered from the same clock pulse, the circuit 110 can be designed to avoid an early start condition due to the speed of the signal launched from the latch 110 to the receiver latch 130 being delayed by the NAND 120.

However, if it turns out that, in reality, the arrival times of the signals at the NAND 120 gate through path A and path B are both close together in time, this independent description of the delay from each separate path "A" and path "B" through the output can be inaccurate.

For example, if both A and B are substantially simultaneously switching from a low logic state to a high logic state, the transition from a high to low logic state on the output of NAND 120 can be much slower than if path A were constant at a high voltage, and the signal on path B alone were switching from low to high. This can create a problem for the "late arrival" scenario, and would require the clock speed for the system 100 to be slower than expected.

Alternatively, if both inputs, path A and path B, were to switch simultaneously from a high logic state to a low logic state, the output of NAND 120 would rise much more quickly than if one input alone changed its logic state. Therefore, the timing along path B through NAND 120 is dependent on the timing of path A, and vice versa.

Generally, it is difficult to calculate the general interdependence of the timing paths described above in a complex circuit, such as can often be found in an IC. In general, any given signal can interact with dozens of other signals, in many levels of complicated logic, so the dependency of this signal on all of the other inputs can be very complicated to describe. It is therefore useful to build a timing model abstract in which all the input times are known exactly, so that all of the mutual interactions can be calculated and accounted for in an exact way.

However, in the real world, the timing abstract generator does not have perfect information regarding the relative arrival time of all inputs to the circuit 100, such as over path A and path B, since timing models are built before the global timing analysis (that is, the timing analysis of the entire IC) is carried out. Also, as the overall IC design progresses, timing at the abstract level primary inputs changes, perhaps due to changes in circuits of other macros, or as analysis of the global timing picture becomes more advanced or accurate.

Therefore, if a timing model is built with one set of timing assertions, those assertions can quickly become outdated, and a new timing model could be required, which could incorporate the problems from the substantially simultaneous arrival of different signal paths. Or, the circuit 100 could be used in several different applications, wherein arrival timing is different for each. Finally, a difficulty is that, if the timing model for the circuit 100 were to contain delays that were dependent on the arrival time asserted at the primary, there may be situations where the global timing model does not converge to a solution, since changes in input assertions drive changes in timing models, which can drive more changes to input assertions, and so on.

This could happen, for example, if other circuits with features similar to circuit 100 were driving into the primary input of circuit 100, and circuit 100 was also driving into the inputs of these other circuits (say from the output of latch 130). Although such a loop would contain intervening clocked or synchronizing elements such as latches, it is often the case that the arrival time at the output of the latch is influenced by the data arrival time at the latch input, so that from a timing perspective, such loops must be considered.

In, this scenario, the input arrival time at "A" may affect the propagation delay through to the output of latch 130, that is, depending on whether the arrival was simultaneous with B or not. This, in turn, can affect the propagation through the other circuits (again depending on which signals switch simultaneously) which feed back into input "A" of circuit 100, so that the timing of input "A" is now different from what was assumed at the start of the analysis. This will then affect the propagation through to the output of latch 130, and so on.

This whole timing process may oscillate back and forth and may not converge to a unique self-consistent solution. For instance, simultaneous switching in 100 could lead to a longer delay in other circuits feeding A, which then is not switching simultaneously with B any more, which then leads to a shorter delay in the circuits feeding A, which then causes simultaneous switching in 100, which then leads to a longer delay in other circuits feeding A, and so on.

So, in general, it can be difficult to build timing models which depend strongly on the asserted arrival times in this way. Therefore, simplifying assumptions are made during the timing abstraction/model-building process, and these simplifications will introduce varying amounts of "optimism" or "pessimism" into the timing model or abstract, depending on the details of the assumptions made.

For "late mode" timing, an optimistic simplification would result in a modeled timing result which is faster than the real result (this would make the system appear to be able to run faster than it could in reality, and so hence is "optimistic"), and conversely for pessimistic simplifications. For early mode timing, the opposite is true, since any simplifications which slow down the racing path are optimistic, leading to the appearance of increased timing margin in the model (since the failure is observed if the path becomes too fast), and conversely for simplifications which would speed up the timing path in question.

Figure 2:
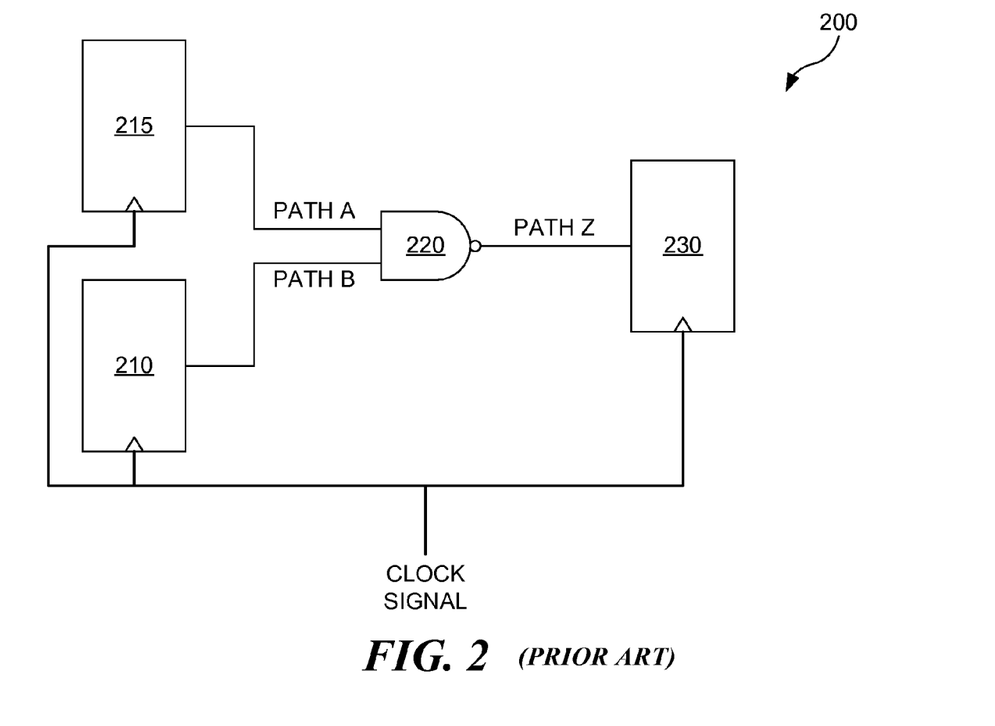
FIG. 2 illustrates a second circuit having potential timing problems in which timing analysis can take place.

Turning now to FIG. 2, illustrated is a system 200 that can have timing problems. A NAND gate 220 has a primary input, path "A", and a secondary input, path "B". The input path "A" is coupled through the output of a latch 215. The output of a latch 210 is coupled to path B, and the output of the NAND gate 220 is coupled to the input of a latch 230. Both the latch 210, 215 and the latch 230 are driven by the same clock signal.

The scenario of FIG. 2 can be used in combining several assumptions. As the timing between both latch 210 and 215 is known for the NAND gate 220 (that is, it is known as defined within the macro), exact timing calculations within the FIG. 2 can be calculated. However, the situation of varying time timing signals arriving outside of the system 200 still exists, and it is still necessary to use the other alternative optimistic or pessimistic alternatives in order to avoid the types of problems described above. Furthermore, a single primary known input can be "contaminated" with variable timing inputs, which feed into its cone of logic from outside of the macro area.

Figure 3A:
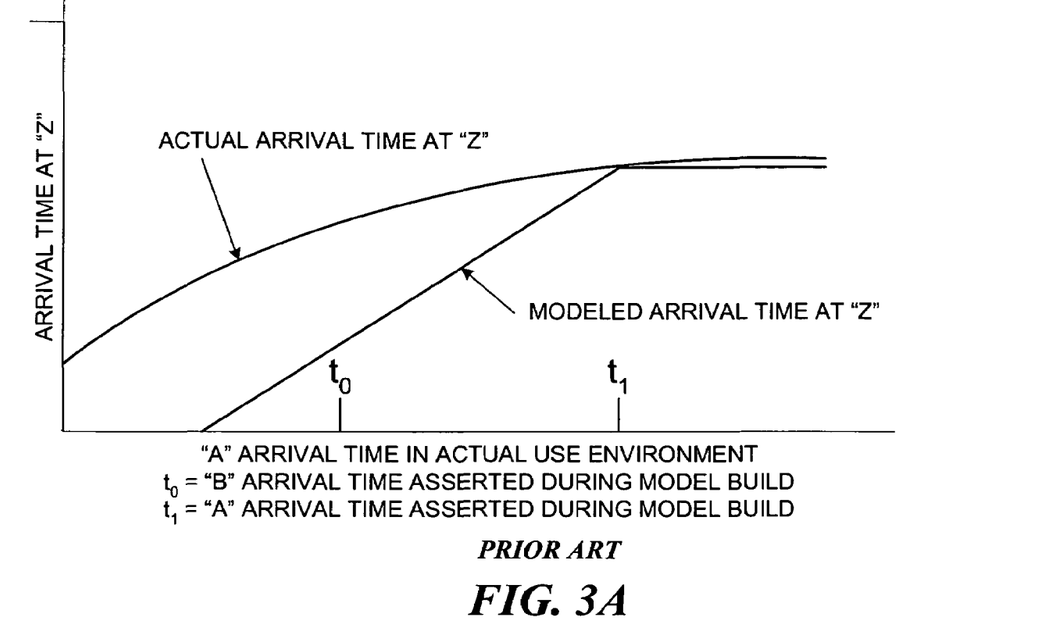
FIG. 3A illustrates a first conventional modeling of propagation times of a first and second signal.

Turning now to FIG. 3A, illustrated is a graph of the conventional behavior of a timing model or circuit 100, 200 or other circuit (for falling inputs A and B) which is built assuming that the arrival time of input "A" is well known and not subject to change. In the situation shown, the arrival time at "Z" is really determined more by the falling input "B", which is simulated during model build to arrive at time t0 (since the NAND gates 120, 220 will switch when just one of its inputs falls). In a timing model built in this way, the arrival time at output "Z" may actually occur before the input "A" arrives. Thus the model may end up containing a negative amount of delay from the input "A" to the output "Z".

In the actual use condition, if signal "A" arrives at time t1, (as assumed during model build) then the timing produced by the model will substantially exactly match the real arrival time at "Z." However, if signal "A" arrives earlier than what was assumed during model build, the arrival time at "Z" predicted by the model becomes correspondingly earlier, as shown in FIG. 3A. Since the model contains a negative amount of delay from the input "A" to the output "Z", the overall delay for the NAND gate may end up being modeled as zero, or even some negative amount. This clearly would be unacceptably pessimistic for early mode timing.

In the timing model of FIG. 3A, if the actual path "A" arrival time is different (relative to "B") from what was assumed when the abstracted macro was built, the model is pessimistic for early mode. The model is only correct when the actual "A" arrival time (relative to "B") matches the arrival time assumed during the model macro build.

Generally, FIG. 3A only gives reasonable results if the signal from path A is at least as late relative to B in the actual use environment as it was in the model build environment. If the relative arrival time of "A" is later in the actual use environment that it was in the model build environment, this model will also be pessimistic, but to a lesser extent.

Figure 3B:
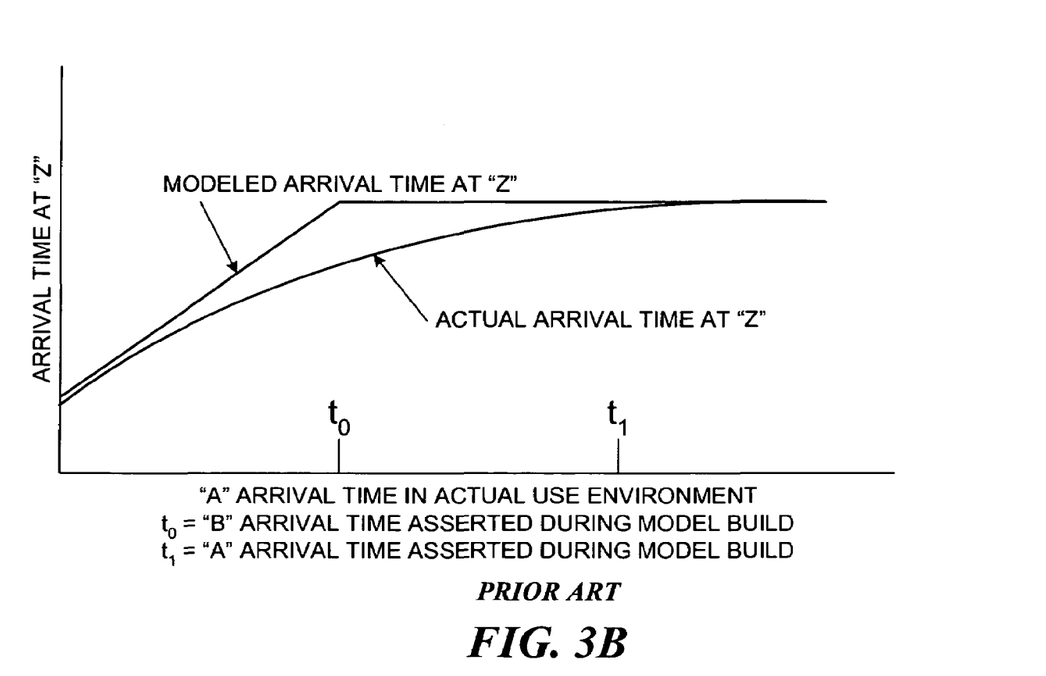
FIG. 3B illustrates a second conventional modeling of propagation times of a first and second signal.

Turning to FIG. 3B, illustrated is an example of a graph of assuming that all inputs to the circuit 100 are totally independent (again, the graph is shown for falling inputs A and B), and then delays calculated on a path-by-path basis. This model is easy to implement, and leads to a timing model which is independent of the relative arrival of the different inputs into the circuit 100. However, this can be optimistic, that is, it over-reports, in the early timing context, the times of early arrivals, and can leave some substantive and significant timing problems undetected. For rising inputs to the NAND gate 120, the situation can be reversed (pessimistic for early mode).

Figure 3C:
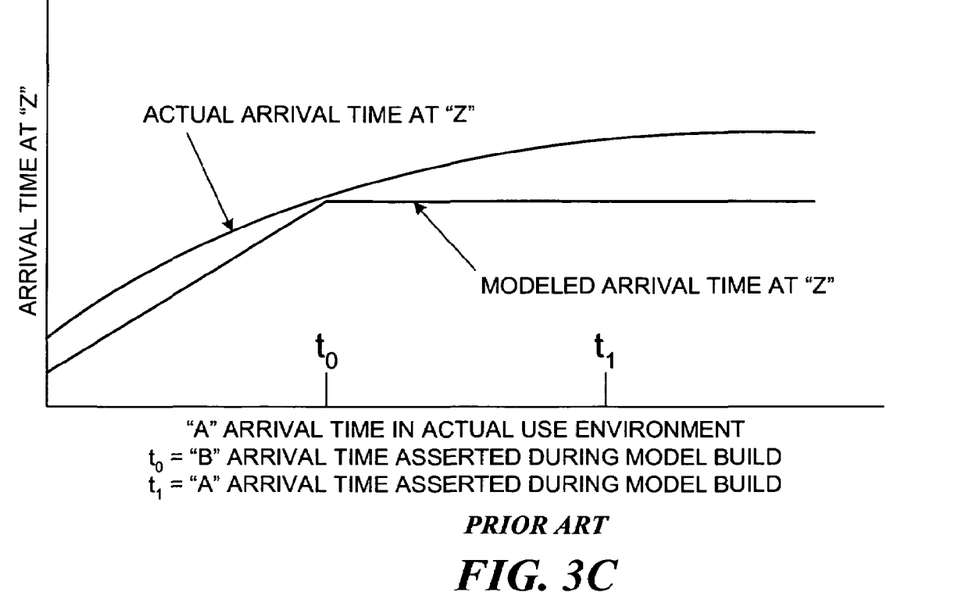
FIG. 3C illustrates a third conventional modeling of propagation times of a first and second signal.

Turning now to FIG. 3C, illustrated is the conventional case when all inputs are assumed to potential simultaneously switch with all other input gates. In other words, both the "A" to "Z" delay and the "B" to "Z" delay are modeled as the delay from either of "B" to "Z" when both of them switch substantially exactly simultaneously. The excess pessimism (early mode) is shown. FIG. 3C is only correct when the signal paths from "A" and "B" actually arrive simultaneously. The model as reported in FIG. 3C is pessimistic. For late mode timing, an analogous situation exists for the timing models illustrated in FIGS. 3A–3C, except that arrival times in which the model errs on the early side are now optimistic, and errors in the later direction are pessimistic.

Figure 4:
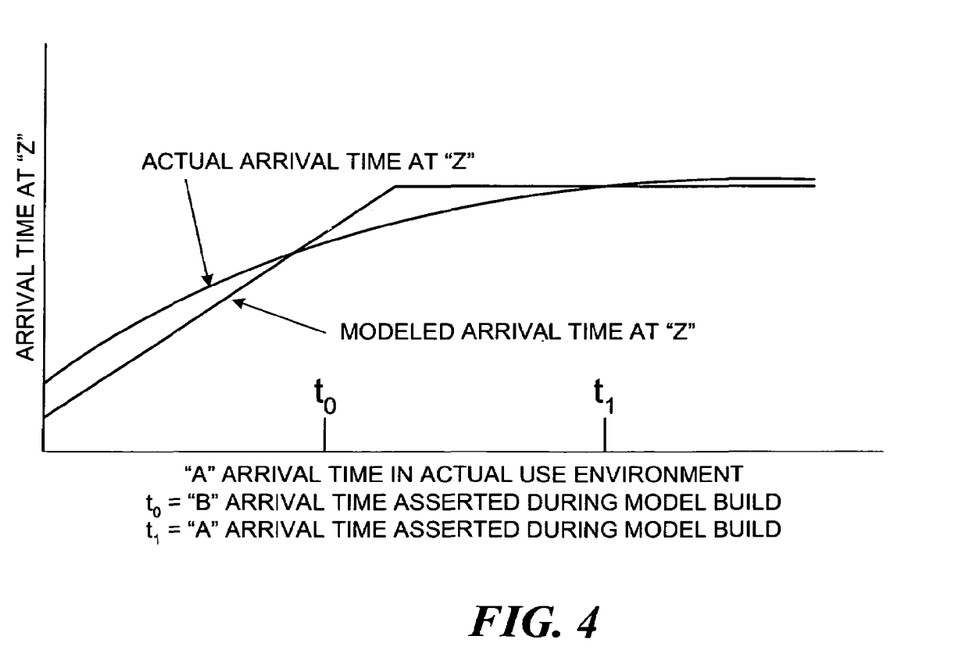
FIG. 4 illustrates modeling of propagation times of a first and second signal.

Turning now to FIG. 4, illustrated is the case of assuming a case that is in accordance with the present invention. An assumption underlying FIG. 4 avoids some of the pessimism described in the previous cases of FIGS. 3A–3C, without introducing excessive optimism into the timing model by making the unwarranted assumption of ignoring simultaneous switching altogether.

In the illustrated FIGS. 3A–C and FIG. 4, the timing models as illustrated in the original, or predicted, timing paths are shown as either horizontal lines or lines at a 45 degree angle, representing delays from "B" to "Z" and delays from "A" to "Z", respectively. Any other feature requires that the timing model include an explicit functional dependence of the delay on the difference of arrival times at "A" and "B". In the case of a two-input gate, this can be easily calculated, but in the more general case of a logic device, the number of functional terms required to represent the dependence can grow to relatively unmanageable proportions quickly. The timing at each output would have to capture the dependence on the relative timing of each input feeding into the cone of logic. With "n" inputs, this means up to n! different relative arrival time sequences to be evaluated, and each sequence would need to be characterized as to the effect of the arrival time spacings between each successive input switch event. With cones of logic often encompassing 10s or even 100s of inputs, the complexity is completely unmanageable.

As illustrated in FIG. 4, such as performed in the processing system of FIG. 5, when tracing the fastest (earliest arrival time) path through the NAND 120 to the output path "Z" from a given input (referred to within this document as the "main" or "primary" input, such as path "A"), to the output of the gate 120, actual arrival times are used for those other inputs ("side inputs, such as path "B") which are later than the main input being traced, while for side inputs whose arrival times are earlier than the main input, the timer assumes that these side inputs could potentially switch simultaneously with the main input.

Conversely, when trying to trace the slowest (latest arrival time) path through the NAND gate 120, actual arrival times are used for those side inputs which are earlier than the main path being traced, while for side inputs whose arrival times are later than the main input, the timer assumes that theses side inputs would potentially switch simultaneously with the main input. Thus, when timing the worst path through the gate, that is, from earliest input, for early mode timing, or from latest input, for late mode timing, the real arrival times are used for those side inputs are used, thereby avoiding the pessimism that would be associated if we had to assume all inputs were potentially simultaneously switching. However, when timing the path through the gate 120 from latest input, for early mode timing, or from earliest input, for late mode timing, the assumption is made that the other inputs could simultaneously switch with the main path input.

In this way, if the later timing model is used in a real-world scenario in which all of the inputs actually ARE substantially simultaneously switching, the model will not be optimistic because, according to the present invention, there will always be one path timed through the gate, wherein all inputs are switching simultaneously. However, in the macro timing model, the pessimistic switch assumption only gets applied to those inputs which have the most timing margin, and are not automatically applied to those inputs with the least margin.

In general, when building circuits, those with not enough margin ("negative slack", or negative margin) need to further fine-tuned, while those with positive margin ("positive slack") meet the design goals and do not need further adjustment. Typically, the amount of positive slack is not very critical, as long as it's positive. So, it can be important to make sure that the paths with the least margin get timed with the most accuracy, because they are the paths that are most likely to have negative slacks, and that will drive most of the circuit rework/iteration as it is attempted to make the whole design meet the design targets.

Figure 5:
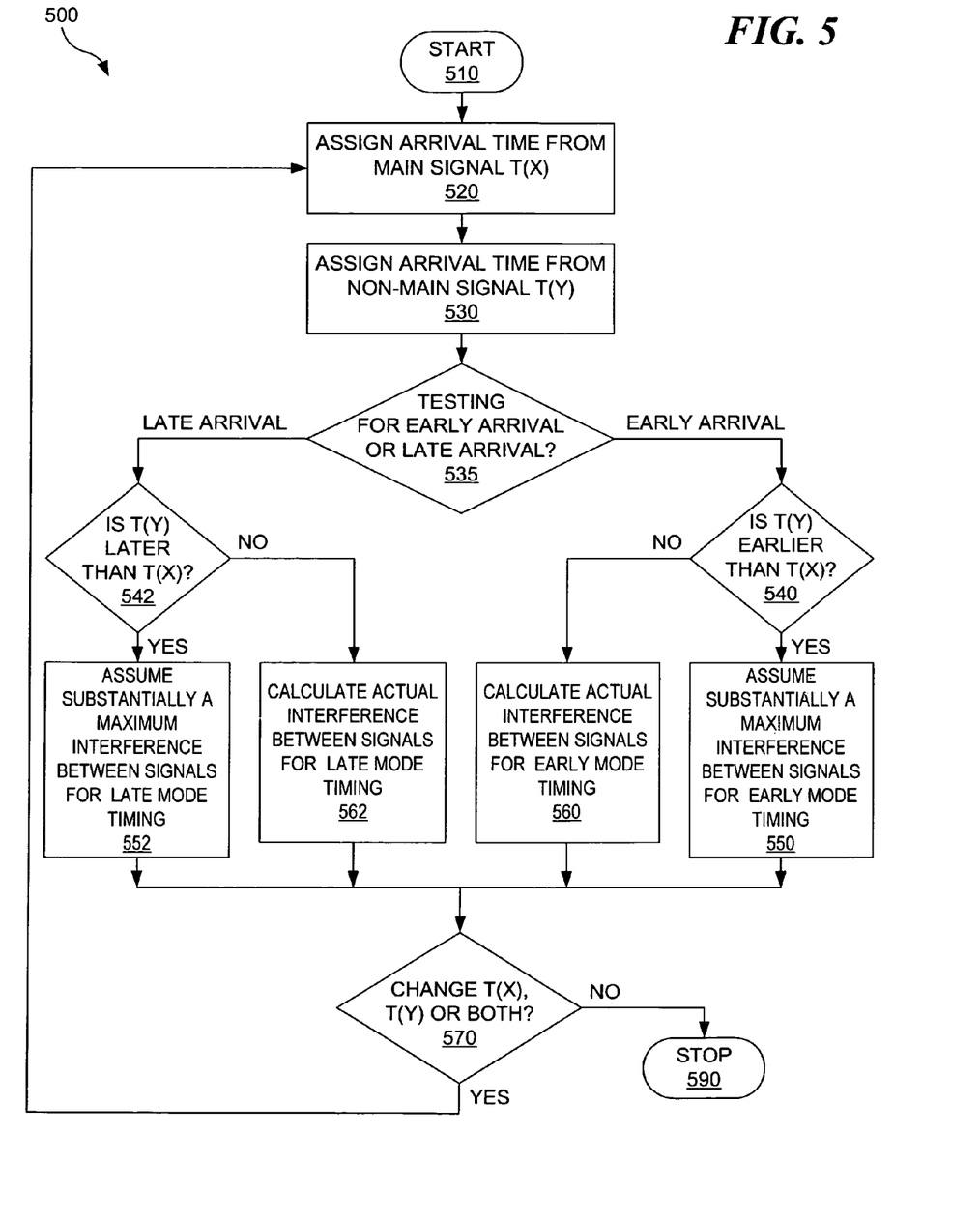
FIG. 5 illustrates a method for modeling the propagation times of FIG. 4.

Turning now to FIG. 5, illustrated is a method 500 for predicting the interplay of two separate input signals to avoid introducing an excessive amount of optimism or pessimism into the circuit design analysis. The method 500 is generally used to determine the propagation speed of the main signal, T(X) with differing receiving times for both the signal propagation of the main signal (the propagation speed being tested), and a secondary signal.

After a start step 510, an arrival time is assigned to the main signal in a step 520. A second arrival time is then assigned for the non-main signal in step 530. In step 535, it is determined whether the simultaneous switching case to be tested for is the "early arrival" or "late arrival" problem. If testing for early arrival, step 540 is executed. If testing for late arrival, step 542 is executed.

In step 540, it is determined whether the second signal is to arrive before the first, or main, signal. If the second signal does not arrive before the first (main) signal, the method 500 calculates the actual interference between the signals in step 560. If the second signal is earlier than the main test signal, the method 500 assumes the worst case scenario of interference for early timing between signals in step 550.

Alternatively, in step 542, after it is determined that the method 500 is testing for a later arrival, it is determined whether T(y), the second signal, is to arrive later than T(x), the main signal. If T(y) is to arrive later than T(x), step 552 is invoked. If T(Y) is not to arrive later than T(x), step 562 is invoked. If the T(Y) is modeled as later, and the method is testing for late arrival, in step 552, worst-case scenario of interference is calculated. If the T(Y) is modeled as earlier, but the method is testing for late arrival, in step 562, the actual ratio of interference is calculated.

In any event, in step 570, it is determined whether to recalculate another arrival time, and whether to change T(X), T(Y) or both. If there are no times to be calculated, then the method stops in stop step 590. If there is another to be calculated, then new times are assigned in step 520.

Figure 6:
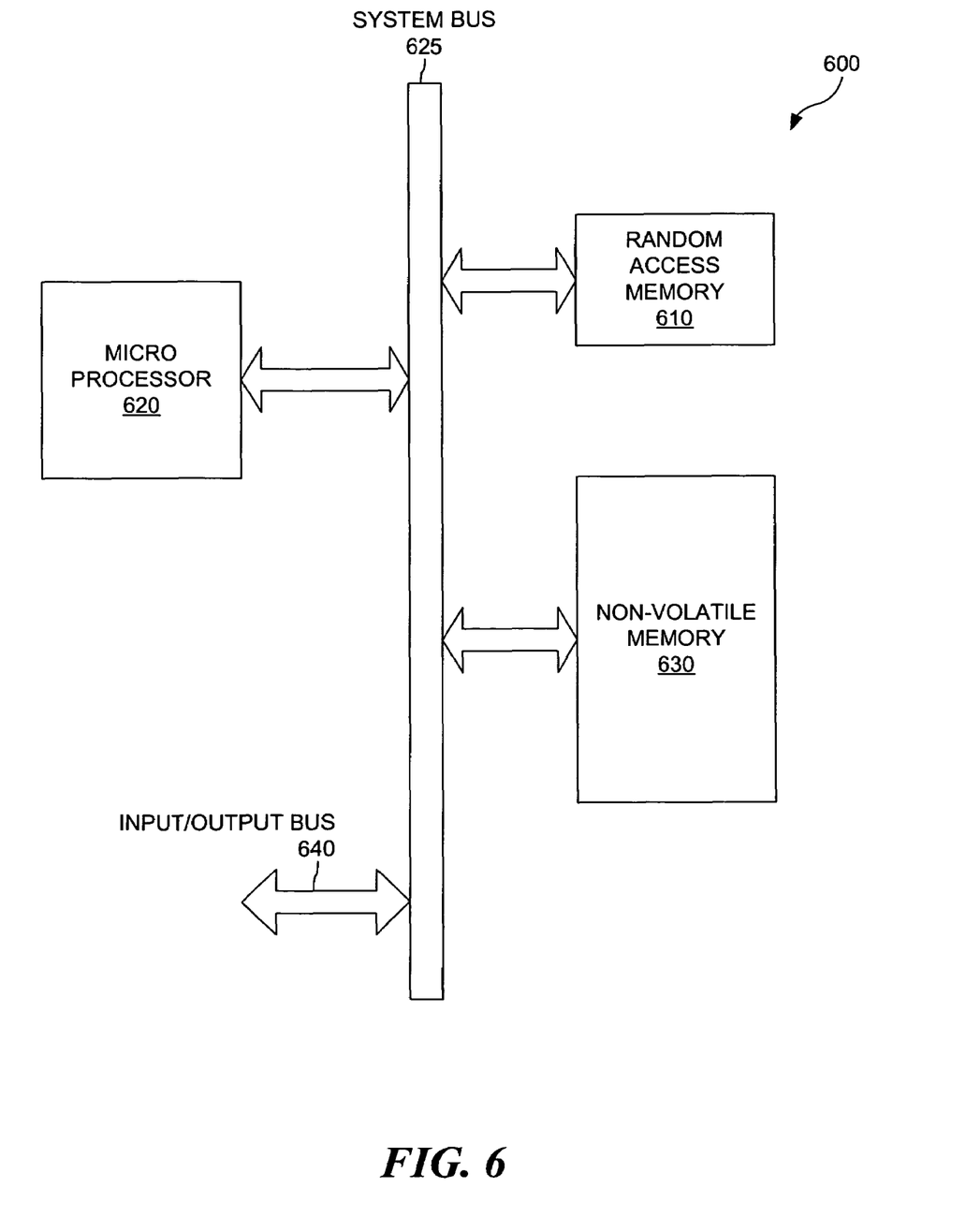
FIG. 6 illustrates one environment in which the modeling of propagation times of a first and second signals can occur.

Turning now to FIG. 6, illustrated is a system 600 for performing the method 500. Steps 510 through 590 can be performed within the microprocessor 620, with reference to information stored within the random access memory 610 and the non-volatile memory 630. The information is conveyed of a system bus 625. The information as to the predictions of interference can then be transferred from the system bus 625 over the input/output bus 640.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. A method for determining arrival times in a circuit, comprising:
   assigning an arrival time for a first signal;
   assigning an arrival time for a secondary signal;
   determining whether a test is for an early arrival or for a late arrival;
   if the test type is for a late arrival, determining whether the arrival time for the secondary signal is later than for the first signal;
   if the test type is for an early arrival, determining whether the arrival time for the secondary signal is earlier than for the first signal; and
   changing the arrival time for the first signal to avoid timing problems in the circuit.

2. The method of claim 1, further comprising, if the test type is for the late arrival and the arrival time for the secondary signal is later than for the first signal, assuming maximum interference between the signals.

3. The method of claim 1, further comprising, if the test type is for the late arrival and the arrival time for the secondary signal is not later than for the first signal, calculating the actual interference between the signals.

4. The method of claim 1, further comprising, if the test type is for the early arrival and the arrival time for the secondary signal is not earlier than for the first signal, calculating the actual interference between the signals.

5. The method of claim 1, further comprising, if the test type is for the early arrival and the arrival time for the secondary signal is earlier than for the first signal, assuming maximum interference between the signals.

6. A method for determining arrival times in a circuit, comprising:
   assigning an arrival time for a first signal;
   assigning an arrival time for a secondary signal;
   determining whether a test is for an early arrival or for a late arrival;
   if the test type is for a late arrival, determining whether the arrival time for the secondary signal is later than for the first signal;
   if the test type is for an early arrival, determining whether the arrival time for the secondary signal is earlier than for the first signal; and
   changing the arrival time for the secondary signal to avoid timing problems in the circuit.

7. A system for calculating signal interference concerning a logic device comprising:
   a primary input to the logic device;
   a secondary input to the logic device;
   a first latch coupled to the secondary input to the logic device;
   a second latch coupled to an output of the logic device;
   a clock signal path coupled to the first and second latches;
   a microprocessor, programmed to employ arrival times of signals received over the primary and secondary inputs to the logic device as a function of a type of timing test that is performed and whether an arrival of a signal over the primary input is earlier or later than an arrival of a signal over the secondary input; and changing the arrival time for the primary signal to avoid timing problems in the device.

8. The system of claim 7, further comprising means for, if the test type is for the late arrival and the arrival time for the secondary signal is later than for the first signal, assuming maximum interference between the signals.

9. The system of claim 7, further comprising means for, if the test type is for the late arrival and the arrival time for the secondary signal is not later than for the first signal, calculating the actual interference between the signals.

10. The system of claim 7, further comprising means for, if the test type is for the early arrival and the arrival time for the secondary signal is not earlier than for the first signal, calculating the actual interference between the signals.

11. The system of claim 7, further comprising, if the test type is for the early arrival and the arrival time for the secondary signal is earlier than for the first signal, assuming maximum interference between the signals.

12. A system for calculating signal interference concerning a logic device comprising:
 a primary input to the logic device;
 a secondary input to the logic device;
 a first latch coupled to the secondary input to the logic device;
 a second latch coupled to an output of the logic device;
 a clock signal path coupled to the first and second latches;
 a microprocessor, programmed to employ arrival times of signals received over the primary and secondary inputs to the logic device as a function of a type of timing test that is performed and whether an arrival of a signal over the primary input is earlier or later than an arrival of a signal over the secondary input; and
 changing the arrival time for the secondary signal to avoid timing problems in the device.

13. A computer program product for timing analysis, the computer program product having a computer-readable medium with a computer program embodied thereon, the computer program which when executed performs the steps comprising:
 assigning an arrival time for a first signal;
 assigning an arrival time for a secondary signal;
 determining whether a test is for an early arrival or for a later arrival;
 if the test type is for a late arrival, determining whether the arrival time for the secondary signal is later than for the first signal;
 if the test type is for an early arrival, determining whether the arrival time for the secondary signal is earlier than for the first signal; and
 changing the arrival time for one of the signals to avoid timing problems in a circuit.

14. A processor for calculating signal interference concerning a logic device, the processor including a computer program which when executed performs the steps comprising:
 assigning an arrival time for a first signal;
 assigning an arrival time for a secondary signal;
 determining whether a test is for an early arrival or for a later arrival;
 if the test type is for a late arrival, determining whether the arrival time for the secondary signal is later than for the first signal;
 if the test type is for an early arrival, determining whether the arrival time for the secondary signal is earlier than for the first signal; and
 changing the arrival time for one of the signals to avoid timing problems in the device.

15. The processor of claim 14, further comprising, if the test type is for the late arrival and the arrival time for the secondary signal is later than for the first signal, computer code for assuming maximum interference between the signals.

16. The processor of claim 14, further comprising, if the test type is for the late arrival and the arrival time for the secondary signal is not later than for the first signal, computer code for calculating the actual interference between the signals.

17. The processor of claim 14, further comprising, if the test type is for the early arrival and the arrival time for the secondary signal is not earlier than for the first signal, computer code for calculating the actual interference between the signals.

* * * * *